(12) United States Patent  (10) Patent No.: US 8,525,351 B2
Ikenaga et al.  (45) Date of Patent: Sep. 3, 2013

(54) SEMICONDUCTOR DEVICE, SUBSTRATE FOR PRODUCING SEMICONDUCTOR DEVICE AND METHOD OF PRODUCING THEM

(75) Inventors: Chikao Ikenaga, Tokyo (JP); Kentarou Seki, Tokyo (JP); Kazuhito Hosokawa, Ibaraki (JP); Takuji Okeyui, Ibaraki (JP); Keisuke Yoshikawa, Ibaraki (JP); Kazuhiro Ikemura, Ibaraki (JP)

(73) Assignees: Dai Nippon Printing Co., Ltd., Tokyo (JP); Nitto Denko Corporation, Ibaraki-shi (JP)

( * ) Notice: Subject to any disclaimer, the term of this patent is extended or adjusted under 35 U.S.C. 154(b) by 16 days.

(21) Appl. No.: 13/207,096

(22) Filed: Aug. 10, 2011

(65) Prior Publication Data

US 2011/0291303 A1  Dec. 1, 2011

Related U.S. Application Data

(62) Division of application No. 11/632,348, filed as application No. PCT/JP2005/012906 on Jul. 13, 2005, now Pat. No. 8,018,044.

(30) Foreign Application Priority Data

Jul. 15, 2004 (JP) ................................. 2004-208322

(51) Int. Cl.
  *H01L 23/485*  (2006.01)
(52) U.S. Cl.
  USPC .......................................... 257/783; 257/787

(58) Field of Classification Search
  USPC ................. 257/676, 678, 690, 691, 692, 700, 257/778, 787
  See application file for complete search history.

(56) References Cited

U.S. PATENT DOCUMENTS 4,259,684 A   3/1981  Dean et al.
6,451,627 B1 * 9/2002  Coffman ....................... 438/111
(Continued)

FOREIGN PATENT DOCUMENTS

JP  A 09-252014   9/1997
JP  A 2001-110945  4/2001
(Continued)

OTHER PUBLICATIONS

Office Action issued in Japanese Patent Application No. 2006-519632, mailed Dec. 10, 2010 (w/English-language Translation).

*Primary Examiner* — Marcos D. Pizarro
*Assistant Examiner* — Sue Tang
(74) *Attorney, Agent, or Firm* — Oliff & Berridge, PLC (57) ABSTRACT

A semiconductor device includes a die pad, a semiconductor element which is loaded on the die pad, and a sealing resin. A plurality of electrically conductive portions each having a layered structure including a metal foil comprising copper or a copper alloy, and electrically conductive portion plating layers provided at both upper and lower ends of the metal foil are arranged around the die pad. The die pad has a lower die pad plating layer, and the semiconductor element is loaded on the die pad comprising such a die pad plating layer. Electrodes provided on the semiconductor element are electrically connected with top ends of the electrically conductive portions via wires, respectively. The lower electrically conductive portion plating layers of the electrically conductive portions and the die pad plating layer of the die pad are exposed outside from the sealing resin on their back faces.

6 Claims, 7 Drawing Sheets

(56) References Cited

U.S. PATENT DOCUMENTS

| | | | |
|---|---|---|---|
| 6,528,893 B2 * | 3/2003 | Jung et al. | 257/787 |
| 6,548,328 B1 * | 4/2003 | Sakamoto et al. | 438/121 |
| 2004/0097017 A1 | 5/2004 | Shimanuki | |

FOREIGN PATENT DOCUMENTS

| JP | A 2001-210743 | 8/2001 |
|---|---|---|
| JP | A 2004-119726 | 4/2004 |
| JP | A 2004-179622 | 6/2004 |

* cited by examiner

SEMICONDUCTOR DEVICE, SUBSTRATE FOR PRODUCING SEMICONDUCTOR DEVICE AND METHOD OF PRODUCING THEM

This is a Division of application Ser. No. 11/632,348 filed Mar. 5, 2007, which is a National Stage Application of PCT/JP2005/012906 filed Jul. 13, 2005. The entire disclosure of the prior applications is hereby incorporated by reference herein in its entirety.

BACKGROUND OF THE INVENTION

1. Field of the Invention

The present invention relates to a technical field of a surface-mounting type semiconductor device, and particularly to a technical field of a surface-mounting type semiconductor device having a leadless structure.

2. Background Art

Generally, a semiconductor device includes a metallic lead frame as one component thereof, and micromachining for the pitch of leads in the lead frame is required for forming a greater number of pins therein. However, if attempting to reduce the width of each lead itself, the strength of the lead is lowered, and a short circuit may tend to occur due to bending or similar deformation of the lead. Accordingly, it is unavoidable to upsize the package in order to ensure the pitch of each lead. Thus, a semiconductor device including a lead frame tends to have a package of a greater size and thickness. Therefore, a surface-mounting type semiconductor device having a leadless structure has been proposed.

Figure 9:
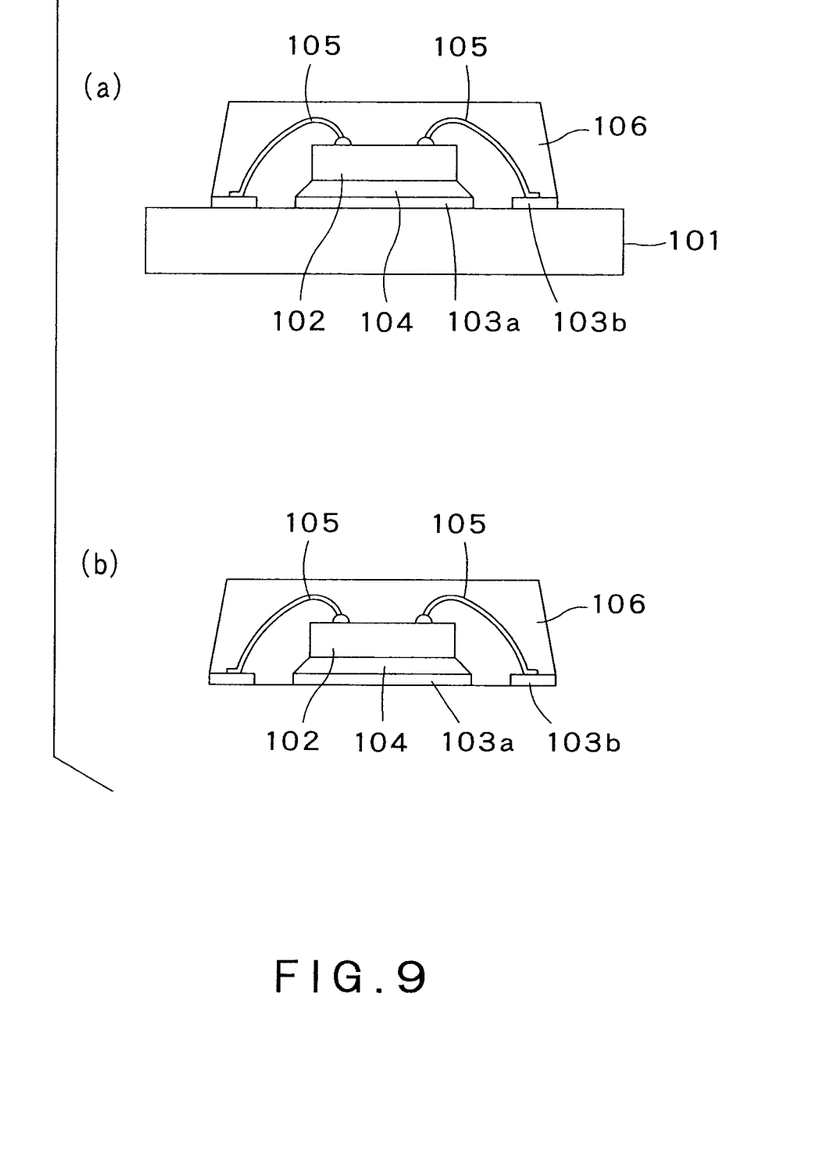
FIGS. 9(a) and 9(b) are diagrams illustrating one example of a conventional semiconductor device having a leadless structure.

Patent Document 1: TOKUKAIHEI No. 9-252014, KOHO
Patent Document 2: TOKUKAI No. 2001-210743, KOHO A semiconductor device described in the Patent Document 1 is shown in FIGS. 9(a) and 9(b). The method of producing the semiconductor device comprises attaching a metal foil onto a base material 101 and etching it such that the metal foil remains at predetermined portions, fixing a semiconductor element 102 onto a metal foil 103a (die pad) having substantially the same size as that of the semiconductor element 102 by using an adhesive 104, electrically connecting the semiconductor element 102 and metal foils 103b via wires 105, and transfer molding the connected structure with a sealing resin 106 using a mold (FIG. 9(a)). Finally, the molded sealing resin 106 is removed from the base material 101 to form a package of the semiconductor element (FIG. 9(b)). However, in the semiconductor device formed by this production method, the adhesive 104 and the metal foil 103a (die pad) are associated with the semiconductor element 102. Therefore, there still is a need for a semiconductor device which has a smaller size and a thinner shape.

Figure 10:
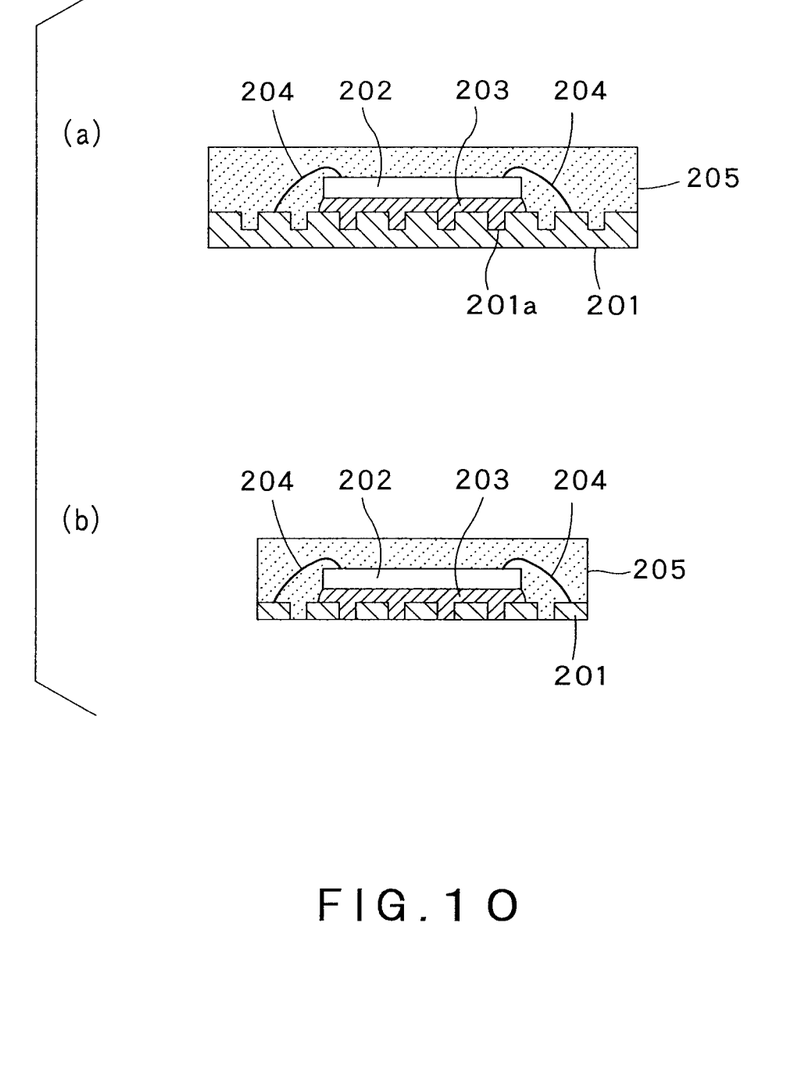
FIGS. 10(a) and 10(b) are diagrams illustrating another example of a conventional semiconductor device having a leadless structure.

FIGS. 10(a) and 10(b) illustrate a semiconductor device described in the Patent Document 2. Generally, the semiconductor device is produced by the following method. First, a metal plate 201 is obtained by forming square-shaped concave grooves 201a in a metal plate 201 used as a base material. Next, a semiconductor element 202 is fixed onto the metal plate 201 using an adhesive 203, wires 204 are then provided by wire bonding at positions required for a design, thereafter the so formed structure is transfer molded with a sealing resin 205 (FIG. 10(a)). Subsequently, the metal plate 201 and adhesive 203 are grinded together, and the metal plate 201 is cut with the sealing resin 205 in accordance with dimensions conforming to the design so as to obtain a semiconductor device (FIG. 12(b)). However, also in this method, the semiconductor device obtained is associated with the adhesive layer 203 and the metal plate 201 under the semiconductor element 202. Therefore, it is difficult to obtain a thinner-type semiconductor device as desired in the art.

Thus, in the conventional methods, it is difficult to obtain a thinner type semiconductor device. Accordingly, in order to obtain a thinner type semiconductor device, the semiconductor element (chip) itself must be grinded into a thinner one, thus increasing occurrence of breakage or cracks in the semiconductor element during such a production step and hence leading to increase of the cost.

In such a one-side-sealed type semiconductor device, ground bonding is sometimes provided on a die pad after a semiconductor element is loaded onto the die pad. In this case, a bonding portion is formed in the same plane as the bottom face of the semiconductor element. Thus, due to the difference in thermal expansion between the semiconductor element, substrate and sealing resin, if peeling occurs along the boundary between the sealing resin and the substrate from an outer periphery of the bottom face of the semiconductor element, such peeling eventually causes the wires in the ground bonding portion provided in the same plane to be peeled off at the same time, as such leading to an electrically opened state.

SUMMARY OF THE INVENTION

The present invention was made in light of the above problems. It is therefore an object of the present invention to provide a highly reliable surface-mounting type semiconductor device having a leadless structure which can be provided at a low cost and capable of further thinning as well as to provide a substrate for use in production of the semiconductor device and a method of producing them.

The present invention is a semiconductor device, comprising: a die pad; a semiconductor element loaded on the die pad, having electrodes; a plurality of electrically conductive portions arranged around the die pad; wires for connecting the electrodes of the semiconductor element and the electrically conductive portions; and a sealing resin for sealing at least the semiconductor element, electrically conductive portions and wires; wherein each of the electrically conductive portions includes a metal foil, electrically conductive portion plating layers provided on both upper and lower ends of the metal foil; wherein the die pad includes a die pad plating layer provided on the same plane as lower electrically conductive portion plating layers of the electrically conductive portions; and wherein the lower electrically conductive portion plating layers of the electrically conductive portions and the die pad plating layer of the die pad are exposed outside from the sealing resin at their back faces.

The present invention is the semiconductor device, wherein the die pad includes a bank portion having a concave portion formed therein, the bank portion including a metal foil and both upper and lower plating layers respectively provided on the same planes as the metal foil of the electrically conductive portions and both the upper and lower electrically conductive portion plating layers of the electrically conductive portions, the lower plating layer of the bank portion being integrally formed with the die pad plating layer; and wherein the semiconductor element is placed in a concave portion of the bank portion, and the electrodes of the semiconductor element and the bank portion are connected via additional wires.

The present invention is the semiconductor device, wherein the electrodes of the semiconductor element are connected with the upper electrically conductive portion plating layers of the electrically conductive portions via the wires and connected with the upper plating layer of the bank portion via the additional wires.

The present invention is the semiconductor device, wherein both the upper and lower electrically conductive portion plating layers of the electrically conductive portions have multi-layered structures, each including a precious metal plating layer.

The present invention is the semiconductor device, wherein a central portion of the metal foil in each of the electrically conductive portions and the bank portion is narrowed relative to both the upper and lower electrically conductive portion plating layers.

The present invention is the semiconductor device, wherein any of the lower electrically conductive portion plating layers of the electrically conductive portions, the lower plating layer of the bank portion and the die pad plating layer projects outside from the sealing resin.

The present invention is the semiconductor device, wherein passages through which the sealing resin can pass are formed in the bank portion.

The present invention is a substrate for use in production of a semiconductor device, comprising: an adhesive sheet having a base layer and an adhesive layer provided on the base layer; and a die pad provided on the adhesive layer of the adhesive sheet and a plurality of electrically conductive portions provided around the die pad; wherein each electrically conductive portion includes a metal foil and electrically conductive portion plating layers provided on both upper and lower ends of the metal foil, and wherein the die pad includes a die pad plating layer provided on the same plane as the lower electrically conductive plating layers of the electrically conductive portions.

The present invention is the substrate for use in production of a semiconductor device, wherein the die pad includes a bank portion having a concave portion formed therein, the bank portion including a metal foil and both upper and lower plating layers respectively provided on the same planes as the metal foil of the electrically conductive portions and both the upper and lower electrically conductive portion plating layers of the electrically conductive portions; and wherein the concave portion of the bank portion serves to receive the semiconductor element therein.

The present invention is the substrate for use in production of a semiconductor device, wherein both the upper and lower electrically conductive portion plating layers of the electrically conductive portions have multi-layered structures each including a precious metal plating layer.

The present invention is the substrate for use in production of a semiconductor device, wherein a central portion of the metal foil in each of the electrically conductive portions and the bank portion is narrowed relative to both the upper and lower electrically conductive portion plating layers.

The present invention is the substrate for use in production of a semiconductor device, wherein passages through which the sealing resin can pass are formed in the bank portion.

The present invention is the substrate for use in production of a semiconductor device, wherein the base layer of the adhesive sheet is made of a metal.

The present invention is a method of producing a substrate for use in production of a semiconductor device, comprising the steps of: preparing a metal foil; providing partially plating layers to portions corresponding to each electrically conductive portion of the metal foil as well as to a portion corresponding to a die pad of the metal foil; attaching the bottom face of the metal foil having the partially plating layers formed thereon to an adhesive layer side of an adhesive sheet having a base layer and the adhesive layer; forming electrically conductive portions by etching the metal foil using each partially plating layer as a resist, each electrically conductive portion including a metal foil and electrically conductive portion plating layers provided at both upper and lower ends of the metal foil, and forming a die pad having a die pad plating layer provided on the same plane as the lower electrically conductive portion plating layer of each electrically conductive portion; and determining an outer shape of the adhesive sheet by processing the adhesive sheet.

The semiconductor device according to the present invention has a leadless structure which is free of a lead frame, and is intended to achieve thinning such that only a die pad plating layer exists under the semiconductor device. Since ground bonding is provided at sites higher than the plane in which the bottom face of the semiconductor device extends, the ground bonding sites will not be affected even though peeling occurs at the bottom face of the semiconductor device, thus preventing electrically opening, thereby enhancing reliability.

DETAILED DESCRIPTION OF THE INVENTION

Hereinafter, one embodiment of the present invention will be described in detail with reference to drawings.

Figure 1:
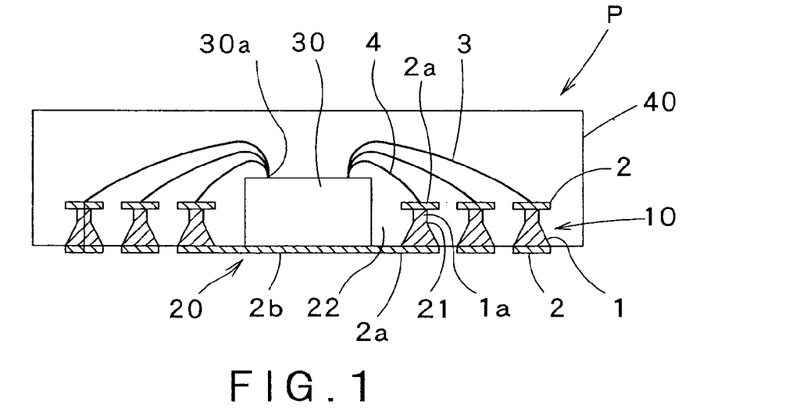
FIG. 1 is a schematic diagram shown in a vertical section of one example of a semiconductor device according to the present invention.
Figure 2:
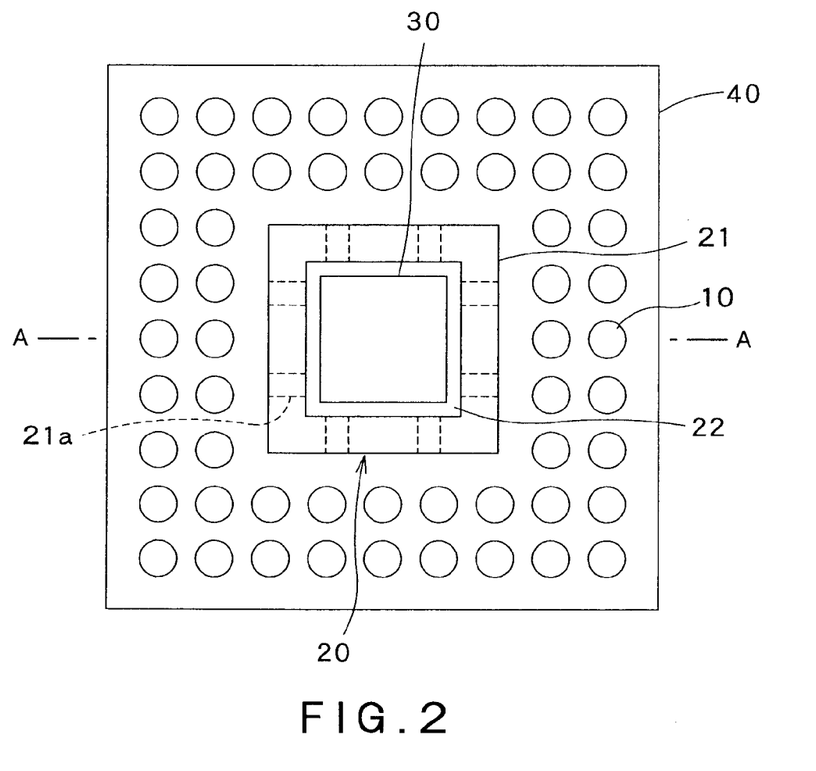
FIG. 2 is an illustration shown in a plan view seeing through the semiconductor device of FIG. 1 with the wires omitted.

FIG. 1 is a schematic diagram shown in a vertical section of a semiconductor device according to the present invention. FIG. 2 is an illustration shown in a plan view seeing through the semiconductor device of FIG. 1 with the wires omitted, and line A-A of FIG. 2 corresponds to the expression shown in FIG. 1.

As shown in FIG. 1, a semiconductor device P comprises a die pad 20, a semiconductor element 30 mounted on the die pad 20 and having electrodes 30a, a plurality of electrically conductive portions 10 arranged around the die pad 20, wires 3 for respectively connecting the electrodes 30a of semiconductor element 30 and the electrically conductive portions 10, and a sealing resin 40 for sealing at least the semiconductor element 30, the electrically conductive portions 10 and the wires 3.

Among these elements, each of the electrically conductive portions 10 includes a metal foil 1 formed from copper or a copper alloy, and electrically conductive portion plating layers 2,2 provided on both upper and lower ends of the metal foil 1. The die pad 20 has a die pad plating layer 2b provided in the same plane as the lower electrically conductive portion plating layer 2 of each electrically conductive portion 10, and the semiconductor element 30 is loaded on the die pad plating layer 2b.

The die pad 20 has a bank portion 21 on the inside of which is formed a concave portion 22 for receiving the semiconductor element 30 therein. The bank portion 21 includes a metal foil 1a provided on the same plane as the metal foil 1 of each electrically conductive portion 10 and plating layers 2a, 2a provided on both upper and lower ends of the metal foil 1a are on the same plane as the electrically conductive portion plating layers 2, 2 of each electrically conductive portion 10.

The metal foil 1 of each electrically conductive portion 10 comprises copper or a copper alloy as described above, and the metal foil 1a of the bank portion 21 comprises the same material as the metal foil 1 of each electrically conductive portion 10.

Furthermore, the plating layers 2a, 2a on both upper and lower ends of the bank portion 21 are formed from the same material as the electrically conductive portion plating layers 2, 2 on both upper and lower ends of each electrically conductive portion 10.

In this way, the structure of layers 2a, 1a, 2a of the bank portion 21 of the die pad 20 is substantially the same as the structure of layers 2, 1, 2 of each electrically conductive portion 10.

The lower plating layer 2a of the bank portion 21 of the die pad 20 is formed integrally with the die pad plating layer 2b.

The semiconductor element 30 is received in the concave portion 22 surrounded by the bank portion 21 of the die pad 20, and the electrodes 30a of the semiconductor element 30 and the upper electrically conductive portion plating layers 2 of the electrically conductive portions 10 are electrically connected via the wires 3, respectively. In addition, the electrodes 30a of the semiconductor element 30 and the upper plating layers 2a of the bank portion 21 of the die pad 20 are electrically connected via wires (additional wires) 4 so as to provide ground bonding.

The semiconductor element 30, electrically connecting portions 10 and wires 3, 4 are sealed by the sealing resin 40. In this case, the die pad plating layer 2b of the die pad 20, the lower plating layers 2a of the bank portion 21 and the lower plating layers 2 of the electrically conductive portions 10 are exposed outside from the back face of the sealing resin 40. Preferably, the die pad plating layer 2b of the die pad 20, the lower plating layers 2a of the bank portion 21 and the lower plating layers 2 of the electrically conductive portions 10 project outside, by each thickness, from the back face of the sealing resin 40, respectively.

Any of the electrically conductive portions plating layers 2, 2 on both the upper and lower ends of each electrically conductive portion 10, the plating layers 2a, 2a on both the upper and lower ends of the bank portion 21 and the die pad plating layer 2b has a multi-layered structure including a precious metal layer.

Since such a semiconductor device P with a leadless structure has only the die pad plating layer 2b under the semiconductor element 30, a semiconductor which is highly reliable and capable of achieving a thinner structure can be produced.

As shown in the drawings, in each of the electrically conductive portions 10 and the bank portion 21 of the die pad 20, a central portion of the metal foil 1, 1a is narrowed relative to the electrically conductive portion plating layer 2 or plating layer 2a, while the electrically conductive portion plating layer 2 or plating layer 2a overhangs outside. Each of the overhanging portions 2, 2a exhibits an anchoring effect in the sealing resin 40, as such enhancing the joining strength among the electrically conductive portions 10, the die pad 20 and the sealing resin 40. On the other hand, the electrically conductive portion plating layers 2 of the electrically conductive portions 10, the plating layers 2a of the bank portion 21 of the die pad 20, and the die pad plating layer 2b project outside from the back face, respectively, that is, a standoff state can be ensured. Thus, upon mounting the semiconductor device P, floating of the electrically conductive portions (terminals) due to unevenness or foreign matters on a mounting circuit board can be prevented, thereby enhancing reliability of the mounting process. In addition, a short circuit to be caused by a crushed solder cream can also be prevented.

FIGS. 3(a) to 3(d) are diagrams respectively showing steps of a production method of the semiconductor device shown in FIG. 1. With reference to these drawings, a procedure for producing the semiconductor device will be described.

Figure 3:
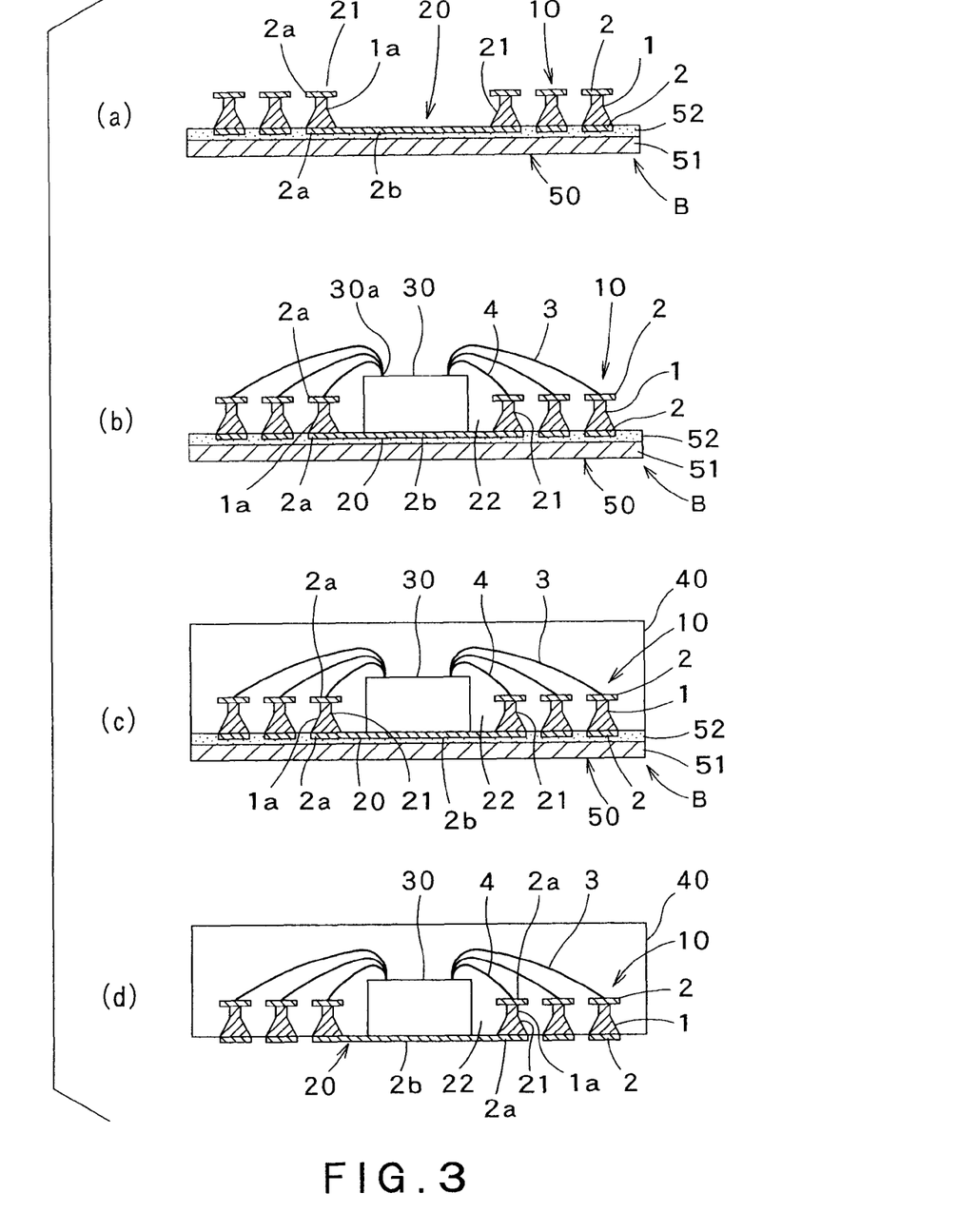
FIGS. 3(a) to 3(d) are diagrams respectively showing steps of a production method of the semiconductor device shown in FIG. 1.

First, as shown in FIG. 3(a), an adhesive sheet 50 including a base layer 51 and an adhesive layer 52 provided on the base layer 51 is prepared. On the adhesive layer 52 of the adhesive sheet 50, a plurality of electrically conductive portions 10 and a die pad 20 having a bank portion 21 on the inside of which a concave portion 22 is formed are provided so as to produce a substrate B. As shown in the drawing, the electrically conductive portions 10 and the bank portion 21 of the die pad 20 include overhanging portions 2, 2a at their upper and lower ends, respectively. A step of preparing a substrate in which such electrically conductive portions 10 and die pad 20 are formed will be described later.

Next, as shown in FIG. 3(b), a semiconductor element 30 is set in the concave portion 22 of the die pad 20, and the semiconductor element 30 is fixed on a die pad plating layer 2b of the die pad 20 with a silver paste or commercially available die attaching material such as a die attaching film or the like. Thereafter, ground bonding is performed between the top face of the bank portion 21 and electrodes 30a of the semiconductor element 30 via wires 4, and the top faces of electrically conductive portions 10 and the electrodes 30a of the semiconductor element 30 are electrically connected via wires 3. In this way, in order to fix the semiconductor element 30 onto the die pad plating layer 2b, the thickness can be reduced by 100 to 200 μm as compared with conventional semiconductor devices.

Figure 4:
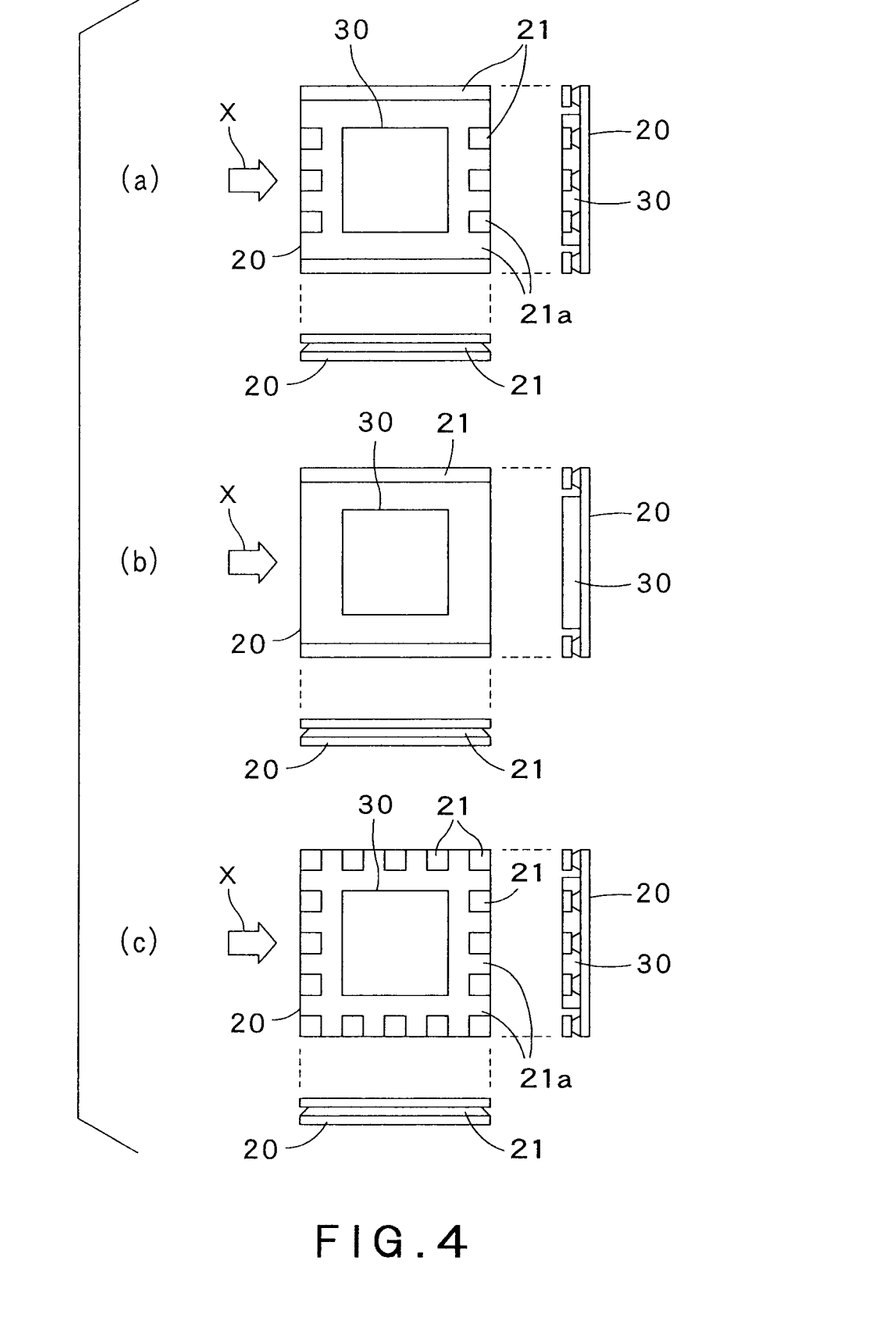
FIGS. 4(a) to 4(c) are diagrams respectively illustrating a case where passages are provided in a bank portion.

Subsequently, as shown in FIG. 3(c), a semiconductor device is formed on the adhesive sheet 50 by sealing the semiconductor element 30, the wires 3, 4, electrically conductive portions 10 and the die pad 20 with a sealing resin 40. This sealing with the sealing resin 40 is performed using a mold by employing a usual transfer molding method. Upon the molding, in order to enhance feed of the sealing resin 40 in the concave portion 22 of the die pad 20, it is preferred to provide passages 21a, as shown in FIG. 2, in the bank portion 21. Specifically, the feed of the sealing resin 40 can be enhanced by providing the passages 21a in the bank portion 21 extending vertical to the flowing direction X of the transfer resin as shown in FIG. 4(a), by removing the bank portion 21 itself extending vertically as shown in FIG. 4(b), or by providing a plurality of passages 21a in the bank portion 21 in both the flowing direction X and the vertical direction as shown in FIG. 4(c). In FIGS. 4(a) to 4(c), those depicted on the right and lower sides are side views seen along the respective directions. After the molding, the sealing resin 40 may be subjected to post-curing by heating as needed. The post-curing by heating may be prior to or after the separation of the adhesive sheet 50 described below. Next, as shown in FIG. 3(d), the semiconductor device P shown in FIG. 1 is obtained by separating the adhesive sheet 50 from the sealing resin 40.

The step of preparing a substrate, i.e., the procedure of forming the plurality of electrically conductive portions 10 and the die pad 20 on the adhesive layer 52 of the adhesive sheet 50 is shown in FIGS. 5(a) to 5(e). The step can be described as follows.

First, a metal foil 60 comprising copper or a copper alloy is prepared as a material for the electrically conductive portions and the die pad. As the metal foil 60, a material having a thickness of from 0.01 to 0.1 mm is used in view of strength. Thereafter, dry film resists are attached onto both faces of the metal foil 60, and as shown in FIG. 5(a), patterning of the dry film resists 61 on both faces of the metal foil 60 is performed using a pattern which is reverse to the shape of the electrically conductive portions by using photolithography.

Figure 5:
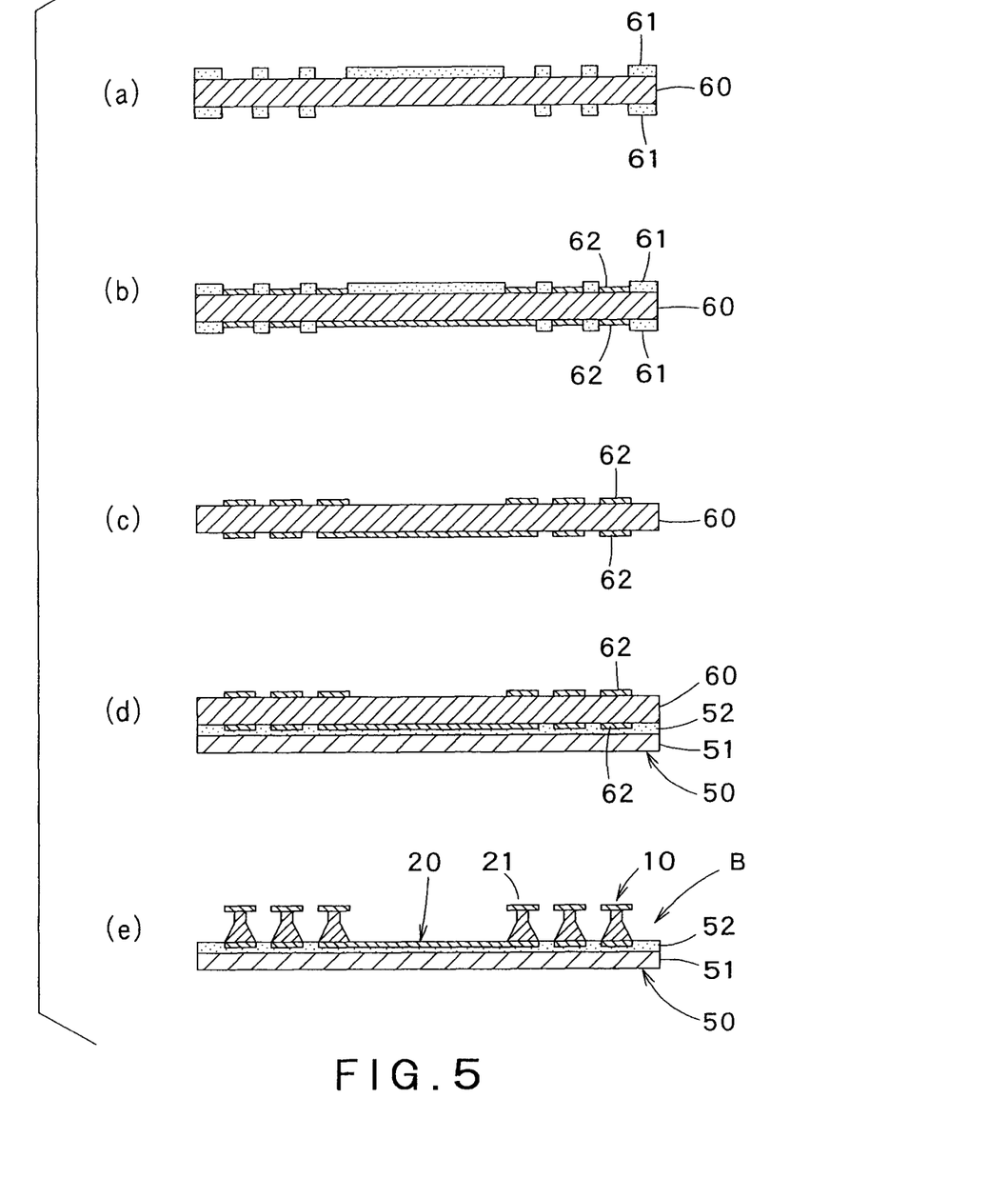
FIGS. 5(a) to 5(e) are diagrams respectively showing a procedure for producing a substrate.

Next, as shown in FIG. 5(b), by using the pattern of dry film resists 61 as a mask, partially plating layers 62 are provided on both faces of metal foils 60 respectively corresponding to the electrically conductive portions 10, and other partially plating layers 62 are provided on both faces of metal foil 60 corresponding to the die pad. Thereafter, as shown in FIG. 5(c), the dry film resists 61 are removed. As shown in an enlarged view of FIG. 6, each partially plating layer 62 comprises a multi-layered structure including a nickel plating as a diffusion barrier layer 63 for copper and a precious metal plating layer 64 provided on the diffusion barrier layer 63. In this case, a precious metal used as the precious metal plating layer 64 may be any of at least Au, Ag, Pd. Additionally, each precious metal plating layer 64 may be mono-layered or multi-layered.

Figure 6:
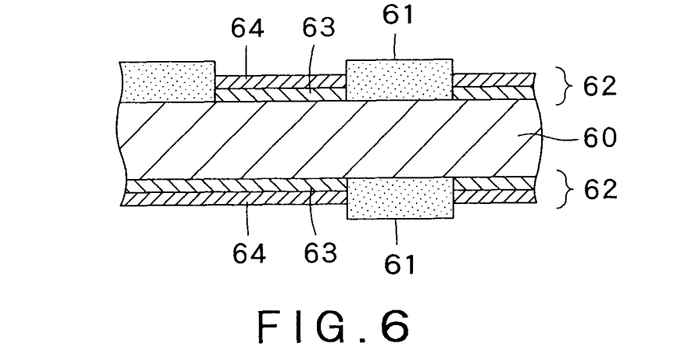
FIG. 6 is an enlarged view of FIG. 5(b).

As a specific example of the partially plating layer 62, there can be mentioned an aspect of forming the layer 62 by layering a palladium plating having a plating thickness of 0.1 μm as the precious metal plating layer 64 on a nickel plating having a plating thickness of 5 μm as the diffusion barrier layer 63, and further layering a gold plating layer having a plating thickness of 0.05 μm on the palladium plating. However, the example is not limited to this aspect, and it is possible to form the partially plating layer 62 by using a combination of various layers and thicknesses depending on the requirement for the semiconductor device to be produced. A suitable total thickness of the partially plating layer 62 is 0.1 to 50 μm.

Subsequently, as shown in FIG. 5(d), the metal foil 60 having the partially plating layers 62 formed on both the front and back faces corresponding to the electrically conductive portions 10 and die pad 20 is attached to the adhesive layer 52 of the adhesive sheet 50, while being pressed against the adhesive sheet 50, such that the partially plating layers 62 are embedded in the adhesive layer 52. Thereafter as shown in FIG. 5(e), the metal foil 60 is etched using the partially plating layers 62 as a resist, so as to form the electrically conductive portions 10 each comprising a metal foil 1 and electrically conductive plating layers 2, 2 provided on both the upper and lower faces of the metal foil 1. In addition, the die pad 20 having a metal foil 1a, or the bank portion 21 comprising plating layers 2a, 2a provided both the upper and lower ends of the metal foil 1a and the die pad plating layer 2b is formed. In this case, etching a side face of each metal foil 60 can create such a shape that overhanging portions each comprising the partially plating layer 62 are provided at the upper and lower ends of the metal foil 60 as shown in the drawing. In this way, after the etching step of the metal foil 60 has been ended, the outer shape of the adhesive sheet 50 is processed by using a cutting means such as press working or the like so as to obtain a substrate B for use in production of a semiconductor device.

Figure 7:
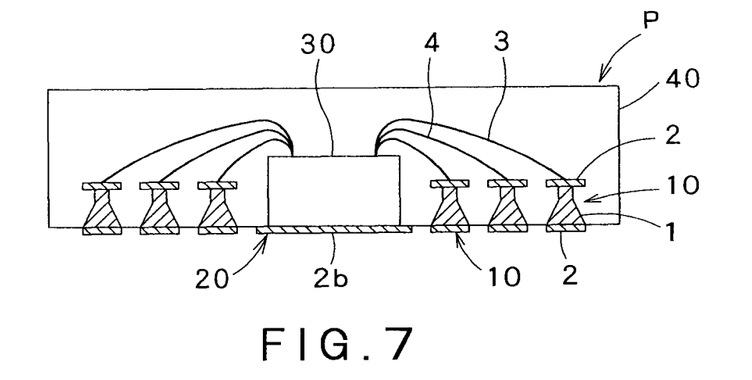
FIG. 7 is a schematic diagram shown in a vertical section of another example of a semiconductor device according to the present invention.

FIG. 7 is a schematic diagram shown in a vertical section of another example of a semiconductor device according to the present invention. The semiconductor device P shown in FIG. 7 has a structure in which the bank portion 21 of the die pad 20 is omitted as compared with the semiconductor device P of FIG. 1. The ground bonding 4 or the power source bonding 3 is connected with an electrically conductive portion 10 which is independent of the die pad 20. In such a structure, a highly reliable semiconductor device which is capable of further thinning can be provided as in the case of the semiconductor device P of FIG. 1.

Figure 8:
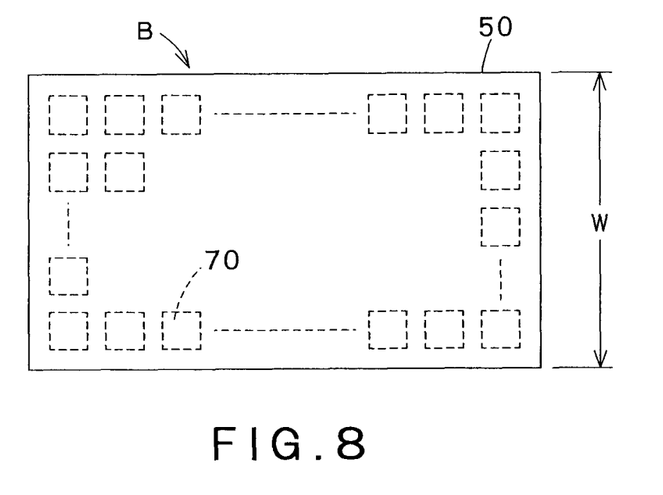
FIG. 8 is a top view of a step of producing a substrate in a production method of a semiconductor device according to the present invention with electrically conductive portions being formed in an adhesive sheet.

It is noted that in the production method of a semiconductor device according to the present invention, it is practical to produce the semiconductor devices collectively in plural numbers. FIG. 8 shows such an example. FIG. 8 is a diagram schematically showing a plan view of the substrate B for use in production of semiconductor devices. On the adhesive sheet 50, a region including one die pad 20 and electrically conductive portions 10 formed around it is expressed as one block 70, each block 70 being formed in a square pattern and provided in large numbers. In FIG. 8, for example, the width (W) of the adhesive sheet 50 is 65 mm, and the multiple blocks 70 are formed on the adhesive sheet 50 through predetermined steps, so that a base material continuously wound around a roll can be produced. The so obtained 65 mm-width substrate B for use in production of semiconductor substrates is used by cutting suitably to obtain a required number of blocks for the following steps of loading semiconductor elements and sealing them with a resin. Thereafter, in the case of collectively sealing such multiple semiconductor devices with a resin, the adhesive sheet is separated after sealing with a resin, followed by dicing or punching into predetermined dimensions to create individual pieces, thus obtaining semiconductor devices.

The adhesive sheet 50 used for the production method of the semiconductor device according to the present invention preferably fixes securely the semiconductor element 30 and the electrically conductive portions 20 until completion of the sealing step using the resin, and can be peeled off with ease when separated from the semiconductor device P. As described above, such an adhesive sheet 50 has the base layer 51 and the adhesive layer 52. The thickness of the base layer 51 is not limited in particular, although it is usually in the range of from 12 to 200 μm, preferably 50 to 150 μm. The thickness of the adhesive layer 52 is not limited in particular, but is usually in the range of from 1 to 50 μm, and preferably 5 to 20 μm.

For the adhesive sheet 50, it is preferred that the elastic modulus at 200° C. of the base layer 51 is greater than 1.0 GPa and that the elastic modulus at 200° C. of the adhesive layer 52 is greater than 0.1 MPa. The details of measurement of the elastic modulus will be described in the following Examples.

In the step of loading the semiconductor element wherein wire bonding is provided, the temperature is controlled to a high temperature condition of approximately 150 to 200° C. Therefore, heat resistance that can withstand such a high temperature condition is required for the base layer 51 and the adhesive layer 52 of the adhesive sheet 50. In view of such a situation, it is preferred to use a material, as the base layer 51, having an elastic modulus at 200° C. of greater than 1.0 GPa, more preferably greater than 10 GPa. Generally, it is preferred that the elastic modulus of the base layer 51 is approximately 1.0 GPa to 1000 GPa. As the adhesive layer 52, it is preferred to use a material having an elastic modulus greater than 0.1 MPa, more preferably greater than 0.5 MPa, still more preferably greater than 1 MPa. Generally, it is preferred that the elastic modulus of the adhesive layer 52 is approximately 0.1 to 100 MPa. The adhesive layer 52 having such an elastic modulus is unlikely to be softened and flowed in the step of loading the semiconductor element, thus enabling stable wire bonding.

By using a material having such a high elastic modulus as the adhesive layer 52, each lower electrically conductive portion plating layer 62 can be pressed and embedded in the adhesive layer 52 due to the attachment with pressure in the step shown in FIG. 5(d). Thus, in the final stage shown in FIG. 3(d), the so-called standoff state that the electrically conductive portion plating layers 2, the plating layers 2a and the die pad plating layer 2b project outside from the surface of the sealing resin 40 can be achieved, thereby enhancing the reliability of the semiconductor device upon mounting.

The base layer 51 of the adhesive sheet 50 may be organic or inorganic. Considering the handling property upon conveyance, a warp caused by molding and the like, it is preferred to use a metal foil. As the metal foil, an SUS foil, Ni foil, Al foil, copper foil or copper alloy foil can be mentioned. It is preferred to select the copper foil or copper alloy foil because of their availability at a low price and variety of types. The metal foil to be used as the base layer 51 is preferably subjected to a roughening treatment on its one side in order to ensure the anchoring property to the adhesive layer 52. As the method of roughening treatment, any of a physical roughening technique such as traditionally known sandblast or a chemical roughening technique such as etching or plating may be used.

As the adhesive for forming the adhesive layer 52 of the adhesive sheet 50, though not limited in particular, it is preferred to use a thermosetting adhesive containing an epoxy resin, an epoxy curing agent and an elastomer. In the case of the thermosetting adhesive, usually, attachment of the substrate can be carried out in an uncured state or in the so-called B stage, that is, it can be carried out at a relatively low temperature, i.e., lower than 150° C. In addition, by curing the adhesive after the attachment, the elastic modulus can be enhanced as well as the heat resistance can be improved.

As the epoxy resin, there can be mentioned glycidilamine-type epoxy resins, bisphenol F-type epoxy resins, bisphenol A-type epoxy resins, phenol novolac-type epoxy resins, cresol novolac-type epoxy resins, biphenyl-type epoxy resins, naphthalene-type epoxy resins, aliphatic epoxy resins, aliphatic cyclic epoxy resins, heterocyclic epoxy resins, spiro-ring containing epoxy resins or halogenated epoxy resins, wherein these compounds may be used alone or in combination of the two or more of them. As the epoxy curing agent, various imidazole compounds and derivatives thereof, amine-type compounds, dicyandiamide, hydrazine compounds or phenol resins can be mentioned, wherein these compounds may be used alone or in combination of the two or more of them. As the elastomer, acryl resins, acrylonitrile-butadiene copolymers, phenoxy resins or polyamide resins can be mentioned. These compounds may be used alone or in combination of the two or more of them.

The adhesive strength to a test metal foil of the adhesive layer 52 is preferably in the range of from 0.1 to 15 N/20 mm, more preferably 0.3 to 15 N/20 mm. The adhesive strength can be selected appropriately in the range described above depending on the size of each electrically conductive portion. Namely, it is preferred that when each electrically conductive portion is of a large size, the adhesive strength is set at a lower value while when the electrically conductive portion is of a small size, the adhesive strength is set at a greater value. The adhesive sheet 50 having such an adhesive strength exhibits a proper adhesive strength, thus reducing or eliminating misregistration of each electrically conductive portion fixed to the adhesive layer in the course from the step of forming substrates to the step of loading semiconductor elements. Meanwhile, in the step of separating the adhesive sheet, the separability of the adhesive sheet from the semiconductor device can be enhanced, thus reducing damage to be given to the semiconductor device. The details of measurement of the adhesive strength will be described in the following Examples.

To the adhesive sheet 50, an antistatic function can be provided as needed. In order to provide an antistatic function to the adhesive sheet 50, there is a method of incorporating an antistatic agent and an electrically conductive filler into the base layer 51 and/or the adhesive layer 52. Alternatively, there is a method of coating an antistatic agent on an interface between the base layer 51 and the adhesive layer 52 and/or on the back face of the base layer 51. The provision of such an antistatic function can control static electricity to be generated upon separating the adhesive sheet from the semiconductor device.

As the antistatic agent, any material having a proper antistatic function can be used without limitation. Specifically, for example, acryl-type amphoteric, acryl-type cationic or maleic anhydride-styrene-type anionic surfactants or the like can be used. As the material for the antistatic layer, specifically, Bondip PA, Bondip PX, Bondip P (manufactured by Konishi Co., Ltd.) or the like can be mentioned. As the electrically conductive filler, commonly known materials can be used. For example, metals, such as Ni, Fe, Cr, Co, Al, Sb, Mo, Cu, Ag, Pt, Au or the like, alloys or oxides thereof, carbon, such as carbon black can be mentioned. These materials can be used alone or in combination of the two or more thereof. The electrically conductive filler may be powder or fibrous. Furthermore, commonly known various additives, such as antioxidants, pigments, plasticizers, fillers, adhesion-rendering agents or the like can be added.

EXAMPLES

Example 1

Preparation of an Adhesive Sheet 100 parts by weight of a bisphenol A-type epoxy resin (produced by Japan Epoxy Resin Co., Ltd ("Epicoat 1002")), 35 parts by weight of an acrylonitrile-butadiene copolymer (produced by Nippon Zeon Co., Ltd. ("Nippol 1072J")), 4 parts by weight of a phenol resin (produced by Arakawa Kagaku Co., Ltd. ("P-180")) and 2 parts by weight of imidazole (produced by Shikoku Fine Co., Ltd. ("C11Z")) were dissolved in 350 parts by weight of methyl ethyl ketone to obtain a solution of an adhesive. This solution was then coated on a copper alloy foil 51 (produced by Japan Energy Co., Ltd. ("BHY-13B-7025")) having a thickness of 100 µm, with its one side roughened. Thereafter, the coated solution was dried for 3 minutes at 150° C. to obtain an adhesive sheet 50 on which an adhesive layer 52 having a thickness of 15 µm is formed. The elastic modulus of the adhesive layer 52 of the adhesive sheet 50 at 100° C. prior to the curing was $2.5 \times 10^{-3}$ Pa, while its elastic modulus at 200° C. after the curing was 4.3 MPa, and the adhesive strength to the copper alloy foil was 12 N/20 mm. Additionally, the elastic modulus at 200° C. of the copper alloy foil used as a base layer 51 was 130 GPa.

(Preparation of a Substrate for Producing Semiconductor Devices)

First, a dry film resist 61 (produced by Tokyo Ouka Co., Ltd. ("Odil AR330")) was laminated on both faces of a copper foil ("Olin 7025") 60 having a thickness of 40 μm. Then, patterning of the dry film resists was performed using a pattern which is reverse to the shape of the electrically conductive portions by using the photolithography. Next, using the so patterned dry film resists as a mask, partially plating layers 62 were formed by successively providing nickel plating and Au plating on both faces of the copper foil. Thereafter, the dry film resists were removed. Subsequently, the copper foil 60 on which layered structures each composed of the nickel plating layer and the Au plating layer were partially arranged was attached with pressure onto the adhesive sheet 50 via the adhesive layer 52. Then, sufficient heat and pressure were applied to prevent a gap from being created between the plating portions and the adhesive layer. In such an attached state, the copper foil 60 was etched using the Au plating layers as a resist so as to form the electrically conductive portions 10 and the die pad 20. In this etching process, etching a side face of copper metal foil 60 can provide overhanging portions 62 each comprising Au and nickel at the upper and lower ends of the copper foil. Finally, the outer shape of the adhesive sheet was processed by press working.

Thereafter, the electrically conductive portions and the die pad were formed on the adhesive sheet 50 by using a pattern as illustrated by the example of FIG. 8 (W was 65 mm). In this case, the electrically conductive portions 10 and the die pad 20 are formed in the pattern shown in FIG. 2 in each block 70.

(Loading of a Semiconductor Element)

A test aluminum deposited silicon chip (6 mm×6 mm) was securely fixed in the concave portion 22 of the die pad 20 of the adhesive sheet 50. Specifically, after coating a die attaching material on the die pad using a dispenser, the silicon chip 30 is loaded onto the die pad and pressed against it such that bubbles do not remain in the die attaching material, followed by heating and pressurization at 150° C. for one hour. Then, using gold wires of a 25 μm diameter, bonding between electrodes 30a of the silicon chip 30 and the bank portion 21 of the die pad 20 and between the electrodes 30a of the silicon chip 30 and the electrically conductive portions 10 were performed.

For 10 units (one unit is 4×4 chips), i.e., 160 pieces of the aluminum deposited chips, the wire bonding was performed. As a result, the success rate of the wire bonding was 100%. Subsequently, molding with a sealing resin (produced by Nitto Denko Co., Ltd. ("HC-100")) was performed by utilizing transfer molding. After the resin molding, the adhesive sheet was peeled off at a room temperature. Furthermore, post curing was performed in a drying apparatus at 175° C. for 5 hours. Thereafter, the post-cured structure was cut by a dicing machine into each one block to obtain the semiconductor devices P.

When observing the interior of each semiconductor device P by using a soft ray apparatus (microfocus X ray television fluoroscope, produced by Shimazu Seisakusho Co., Ltd. ("SMX-100")), it could be confirmed that the semiconductor device P obtained does not include any wire deformation and chip displacement and exhibits highly enhanced joining strength between the electrically conductive portions 10 and the sealing resin, with the overhanging portion 2 of each electrically conductive portion 10 being firmly embedded in the sealing resin.

The conditions of the wire bonding, transfer molding, elasticity modulus measuring method, adhesive strength measuring method, and the success ratio of the wire bonding are as follows:

(Conditions of Wire Bonding)
Apparatus: Produced by Shinkawa Co., Ltd. ("UTC-300BI SUPER")
Ultrasound frequency: 115 KHz
Ultrasound outputting time: 15 milliseconds
Ultrasound output: 120 mW
Bonding load: 1018 N
Searching load: 1037 N (Conditions of Transfer Molding)
Apparatus: TOWA molding machine
Molding temperature: 175° C.
Time: 90 seconds
Clamping pressure: 200 KN
Transfer Speed: 3 mm/sec
Transfer Pressure: 5 KN (Elasticity Modulus Measuring Method)
Subjects to be measured: Both of the base layer and the adhesive layer
Evaluating equipment: Visco-elasticity spectrometer produced by Reometrics Co., Ltd.
("ARES")
Rising temperature speed: 5° C./min
Frequency: 1 Hz
Measuring mode: Pulling mode (Adhesive Strength Measuring Method)
After laminating the adhesive sheet 50 having a with of 20 mm and a length of 50 mm on a 35 μm copper foil (produced by Japan Energy Co., Ltd. ("C7025")) under the conditions of 120° C., 0.5 MPA and 0.5 m/min, the laminated structure was left in a 150° C. hot-air oven for 1 hour, and the 35 μm copper foil was then pulled under atmospheric conditions of a temperature of 23° C. and a relative humidity of 65% RH, at a pulling speed of 300 mm/min, in the direction of 180°, thereby determining the adhesive strength as the central value of the measures.

(Success Ratio of the Wire Bonding)
The pulling strength of the wire bonding was measured by using a bonding tester ("PTR-30") produced by Reska Co., Ltd. in the measuring mode: Pulling test, at a measuring speed of 0.5 mm/sec. The pulling strength was regarded as success when it was 0.04 N or greater while regarded as failure when lower than 0.04 N. The success ratio of the wire bonding was obtained by calculating the ratio of success from the measured results.

Example 2

Semiconductor devices were produced in the same manner as in Example 1 except that an 18 μm copper-nickel alloy foil (produced by Japan Energy Co., Ltd. ("C7025")) was used as the metal foil. As a result, the success ratio of the wire bonding was 100%. When observing the interior of each semiconductor device, it could be confirmed that the semiconductor device P obtained does not include any wire deformation and chip displacement and exhibits highly enhanced joining strength between the electrically conductive portions and the sealing resin.

While the embodiments of the present invention have been described in detail, the semiconductor device and the method of producing thereof according to the present invention are not limited in any way to these embodiments. It should be construed that various modifications can be made without departing from the scope and spirit of the present invention.

The invention claimed is:

1. A substrate for use in production of a semiconductor device, comprising:
   an adhesive sheet having a base layer and an adhesive layer provided on the base layer;
   a die pad provided on the adhesive layer of the adhesive sheet and a plurality of electrically conductive portions provided around the die pad; and
   a semiconductor element loaded on the die pad, having electrodes, wherein
   each electrically conductive portion includes a metal foil and electrically conductive portion plating layers provided on both upper and lower ends of the metal foil,
   the die pad includes a die pad plating layer provided on the same plane as the lower electrically conductive plating layers of the electrically conductive portions,
   the die pad includes a bank portion that has a concave portion formed therein, the bank portion is formed as a continuous portion so as to surround the semiconductor element as viewed from a top of the semiconductor device, and the bank portion includes a metal foil and both upper and lower plating layers,
   the concave portion serves to receive the semiconductor element therein, and
   central portions of the metal foil in each of the electrically conductive portions and the bank portion are narrowed relative to both the upper and lower electrically conductive portion plating layers, and both the upper and lower plating layers respectively.

2. The substrate for use in production of a semiconductor device according to claim 1,
   wherein the metal foil and both the upper and lower plating layers of the bank portion are provided on the same planes as the metal foil of the electrically conductive portions and both the upper and lower electrically conductive portion plating layers of the electrically conductive portions, the lower plating layer of the bank portion being integrally formed with the die pad plating layer.

3. The substrate for use in production of a semiconductor device according to claim 2, wherein
   both the upper and lower electrically conductive portion plating layers of the electrically conductive portions have multi-layered structures each including a precious metal plating layer.

4. The substrate for use in production of a semiconductor device according to claim 2, wherein
   passages through which the sealing resin can pass are formed in the bank portion.

5. The substrate for use in production of a semiconductor device according to claim 1, wherein
   the base layer of the adhesive sheet is made of a metal.

6. A method of producing a substrate for use in production of a semiconductor device, comprising the steps of:
   preparing a metal foil;
   providing partially plating layers to portions corresponding to each electrically conductive portion of the metal foil as well as to a portion corresponding to a die pad of the metal foil;
   attaching the bottom face of the metal foil having the partially plating layers formed thereon to an adhesive layer side of an adhesive sheet having a base layer and the adhesive layer;
   forming electrically conductive portions by etching the metal foil using each partially plating layer as a resist, each electrically conductive portion including a metal foil and electrically conductive portion plating layers provided on both upper and lower ends of the metal foil, and
   forming a die pad having a die pad plating layer provided on the same plane as the lower electrically conductive portion plating layer of each electrically conductive portion;
   loading a semiconductor element having electrodes on the die pad, the die pad including a bank portion that has a concave portion formed therein, the bank portion being formed as a continuous portion so as to surround the semiconductor element as viewed from a top of the semiconductor device, and the bank portion including a metal foil and both upper and lower plating layers; and
   determining an outer shape of the adhesive sheet by processing the adhesive sheet, wherein
   the concave portion serves to receive the semiconductor element therein, and
   central portions of the metal foil in each of the electrically conductive portions and the bank portion are narrowed relative to both the upper and lower electrically conductive portion plating layers.

* * * * *